(12) United States Patent
Gilhotra (10) Patent No.: US 12,057,839 B2
(45) Date of Patent: Aug. 6, 2024

(54) COMMON MODE LOGIC BASED QUADRATURE COUPLED INJECTION LOCKED FREQUENCY DIVIDER WITH INTERNAL POWER-SUPPLY JITTER COMPENSATION

(71) Applicant: Synopsys, Inc., Sunnyvale, CA (US)

(72) Inventor: Yatin Gilhotra, Ambala (IN)

(73) Assignee: SYNOPSYS, INC., Sunnyvale, CA (US)

( * ) Notice: Subject to any disclaimer, the term of this patent is extended or adjusted under 35 U.S.C. 154(b) by 0 days.

(21) Appl. No.: 17/520,050

(22) Filed: Nov. 5, 2021

(65) Prior Publication Data

US 2022/0149846 A1 May 12, 2022

Related U.S. Application Data (60) Provisional application No. 63/110,799, filed on Nov. 6, 2020.

(51) Int. Cl.
*H03K 21/02* (2006.01)
*H03L 7/193* (2006.01)

(52) U.S. Cl.
CPC .......... *H03K 21/023* (2013.01); *H03L 7/193* (2013.01)

(58) Field of Classification Search
CPC ....... H03K 21/00; H03K 21/02; H03K 21/026
See application file for complete search history.

(56) References Cited

U.S. PATENT DOCUMENTS 11,057,039 B1 * 7/2021 Kossel ................. H03K 21/026
11,075,639 B1 * 7/2021 Chakraborty .......... H03B 19/14

* cited by examiner

*Primary Examiner* — Diana J. Cheng
(74) *Attorney, Agent, or Firm* — Lewis Roca Rothgerber Christie LLP (57) ABSTRACT

A circuit includes a clock generator, a frequency divider, and a first biasing circuit. The clock generator generates a clock signal of a first frequency. The frequency divider includes a first pair of cross coupled transistors. The frequency divider produces the clock signal of a second frequency. The first biasing circuit is coupled with the first pair of cross coupled transistors of the frequency divider. The first biasing circuit is adapted to enable a change in a transconductance of the first pair of cross coupled transistors to stabilize a phase angle between the clock signal at the first frequency and the clock signal at the second frequency.

20 Claims, 6 Drawing Sheets

COMMON MODE LOGIC BASED QUADRATURE COUPLED INJECTION LOCKED FREQUENCY DIVIDER WITH INTERNAL POWER-SUPPLY JITTER COMPENSATION

CROSS-REFERENCE TO RELATED APPLICATIONS

The present application claims the benefit under 35 U.S.C. § 119(e) of U.S. Provisional Patent Application No. 63/110,799 filed on Nov. 6, 2020, which is incorporated herein by reference in its entirety for all purposes.

TECHNICAL FIELD

The present disclosure relates generally to a frequency divider. In particular, the present disclosure relates to a common mode logic based quadrature coupled injection locked frequency divider with internal power-supply jitter compensation.

BACKGROUND

High-speed serial links are the backbone of modern communication systems. The high-speed serial links take data from multiple slower lanes and convert the multiple slower lanes into a single high-speed serial lane in order to send the data through long channels. The high-speed serial links fundamentally rely on synchronizing clock signals for all their operations. The clock signals are generated using a phase-locked-loop (PLL). As the speed of the high-speed-links increases, particularly with the advent of 112G Ethernet and PCI Gen 5 protocols, the jitter specifications of a communication system become extremely challenging to achieve.

SUMMARY

In one aspect, a circuit includes a clock generator, a frequency divider, and a first biasing circuit. The clock generator generates a clock signal of a first frequency. The frequency divider includes a first pair of cross coupled transistors. The frequency divider produces the clock signal of a second frequency. The first biasing circuit is coupled with the first pair of cross coupled transistors of the frequency divider. The first biasing circuit is adapted to enable a change in a transconductance of the first pair of cross coupled transistors to stabilize a phase angle between the clock signal at the first frequency and the clock signal at the second frequency.

In one aspect, a frequency divider includes a pair of cross-coupled common mode logic (CML) circuits that receive an input signal of a first frequency and produce an output signal of a second frequency. The second frequency corresponds to the first frequency divided by a factor of two or more. The frequency divider also includes a first biasing circuit coupled with a first transistor of a first CML circuit of the pair of cross-coupled CML circuits. The first biasing circuit bias the first transistor in a triode region. A gate terminal of the first transistor is coupled to the input signal.

In one aspect, a circuit includes a clock generator and a frequency divider. The clock generator generates a clock signal of a first frequency. The frequency divider receives the clock signal and produces an output signal of a second frequency. The frequency divider includes a pair of cross-coupled common mode logic (CML) circuits. Each CIVIL circuit includes a differential transistor pair, a cross-coupled transistor pair, and a biasing circuit. The biasing circuit biases a respective cross-coupled transistor pair in a triode region.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

DETAILED DESCRIPTION

Aspects of the present disclosure relate to common mode logic based quadrature coupled injection locked frequency divider with internal power-supply jitter compensation.

An injection locked frequency divider (ILFD) is one of the primary components of a phase locked loop (PLL) used to synthesize clock signals of various frequencies and phase relationships. PLLs are components of high speed serializer/deserializer (SerDes) technology used in data center and computing applications where very high-speed of data-transfer among modules is used. Both a transmitter and a receiver of a SerDes system use multi-phased synchronization using clock signals from the PLL for their operation. A core voltage controlled oscillator (VCO) produces a single high-frequency clock. In many architectures, ILFDs may be used to generate multi-phased, divided versions of the clocks that are distributed across the system.

The clocks generated by the injection locked frequency dividers, and consequentially the system level performance metrics are prone to external power-supply disturbances. The external power-supply disturbances result in jitter in the clocks that may result in degraded system level performance. Transceivers typically require very high-quality jitter performance. The power-supply induced jitter introduced in the system by the ILFD stage is of significant concern as the ILFD contributes significantly to the overall deterministic jitter. Thus, an ILFD that is resilient to power-supply disturbances is desired. Further, ultra-high-speed SerDes may benefit that the power consumption and the circuit area be as minimum as possible.

Solutions described herein advantageously solve the problem of power-supply induced jitter for reasons including, but not limited to internal jitter compensation in ILFD. The present disclosure solves the problem of power-supply induced jitter in the common-mode-logic (CML) based quadrature coupled injection locked frequency divider (QC-ILFD) popularly used in PLLs for its power and speed efficient performance. A CIVIL-based-QC-ILFD is described that implements an internal power-supply jitter compensation unlike existing solutions where either no internal jitter compensation exists or where jitter reduction is achieved with the help of power and area consuming regulator circuits.

In some embodiments, the present disclosure implements a method to desensitize the ILFD circuit to power-supply noise using a resistor to bias the cross-coupled pairs of D-Latches of the CIVIL based QC-ILFD. The bias resistor compensates for the effect of power-supply noise and keeps the rate of change of a time-constant of a single D-Latch with respect to supply noise low. As a result, momentary changes in frequency are reduced. Thereby, the overall jitter performance is improved.

In addition to significantly reducing the jitter caused by power-supply noise using a bias resistor, the design described herein uses a cross-coupled biasing resistor in comparison to the conventional design that manifests as internal power-supply jitter compensation. Accordingly, hefty regulator circuits that consume large power may be avoided to achieve jitter reduction.

In some embodiments, an electrical current consumed by a circuit depends on a current bias transistor. A minimum amount of electrical current, for example about 5-10% depending on the technology, may get routed through the bias resistor. The bias resistor provides jitter compensation and shows minimal effect on other parameters (e.g., output swing, random-noise, and locking-range). Other solutions to achieve the same jitter performance (e.g., by regulating the power-supply by adding a low-dropout regulator (LDO)) use significant circuit area and power consumption. To compare the solution as described herein with regulator circuits to achieve the same jitter reduction performance, the regulator circuits use at least double circuit area and 1.5 times power consumption.

Figure 1:
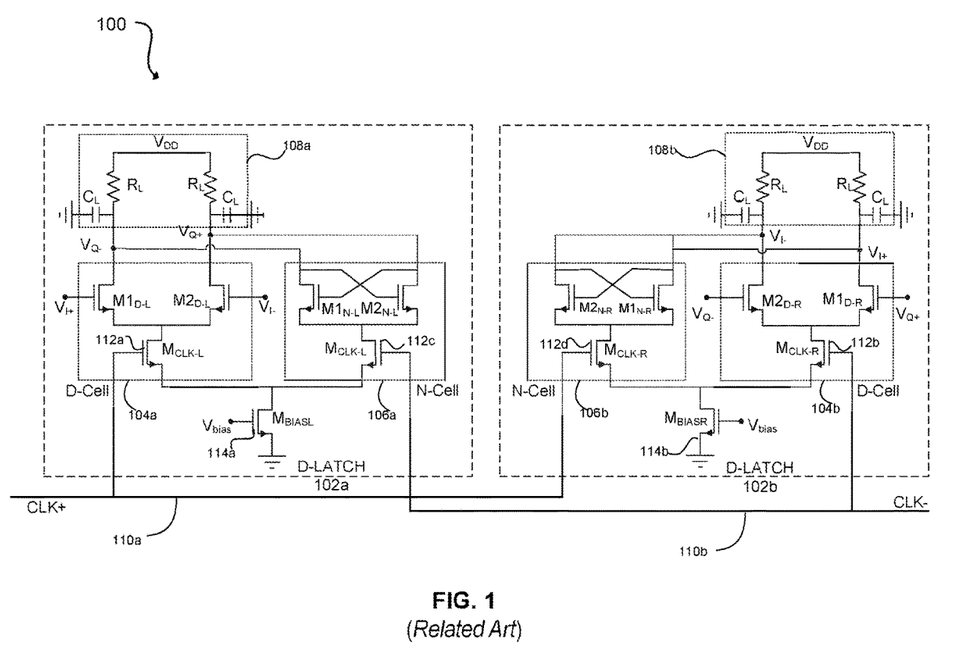
FIG. 1 illustrates a conventional two stage common mode logic (CML) based quadrature coupled injection locked frequency divider (QC-ILFD).

FIG. 1 illustrates a conventional two stage common mode logic (CML) based quadrature coupled injection locked frequency divider (QC-ILFD) 100. The CIVIL based QC-ILFD 100 divides an input frequency by 2 and generates two differential output clocks having a phase difference of 90° as shown in FIG. 2.

QC-ILFD 100 includes a first D-latch 102a and a second D-latch 102b connected as shown in FIG. 1. Each D-latch includes a D-cell that is a differential pair and an N-cell that is a cross-coupled pair (i.e., a negative Gm cell). First D-latch 102a includes D-cell 104a and N-cell 106a. Second D-latch 102b includes D-cell 104b and N-cell 106b. D-cell 104a, D-cell 104b, N-cell 106a, and N-cell 106b are driven by tail switching transistors 112a, 112b, 112c, and 112d. In some aspects, tail switching transistors 112a, 112b, 112c, and 112d are connected to input signals 110a, 110b (e.g., VCO clocks 110a and 110b). Tail switching transistors 112a, 112b, 112c, and 112d are biased using current sources 114a and 114b. D-cell 104a, N-cell 106a, D-cell 104b, and N-cell 106b push the currents into load tanks 108a and 108b.

Figure 2:
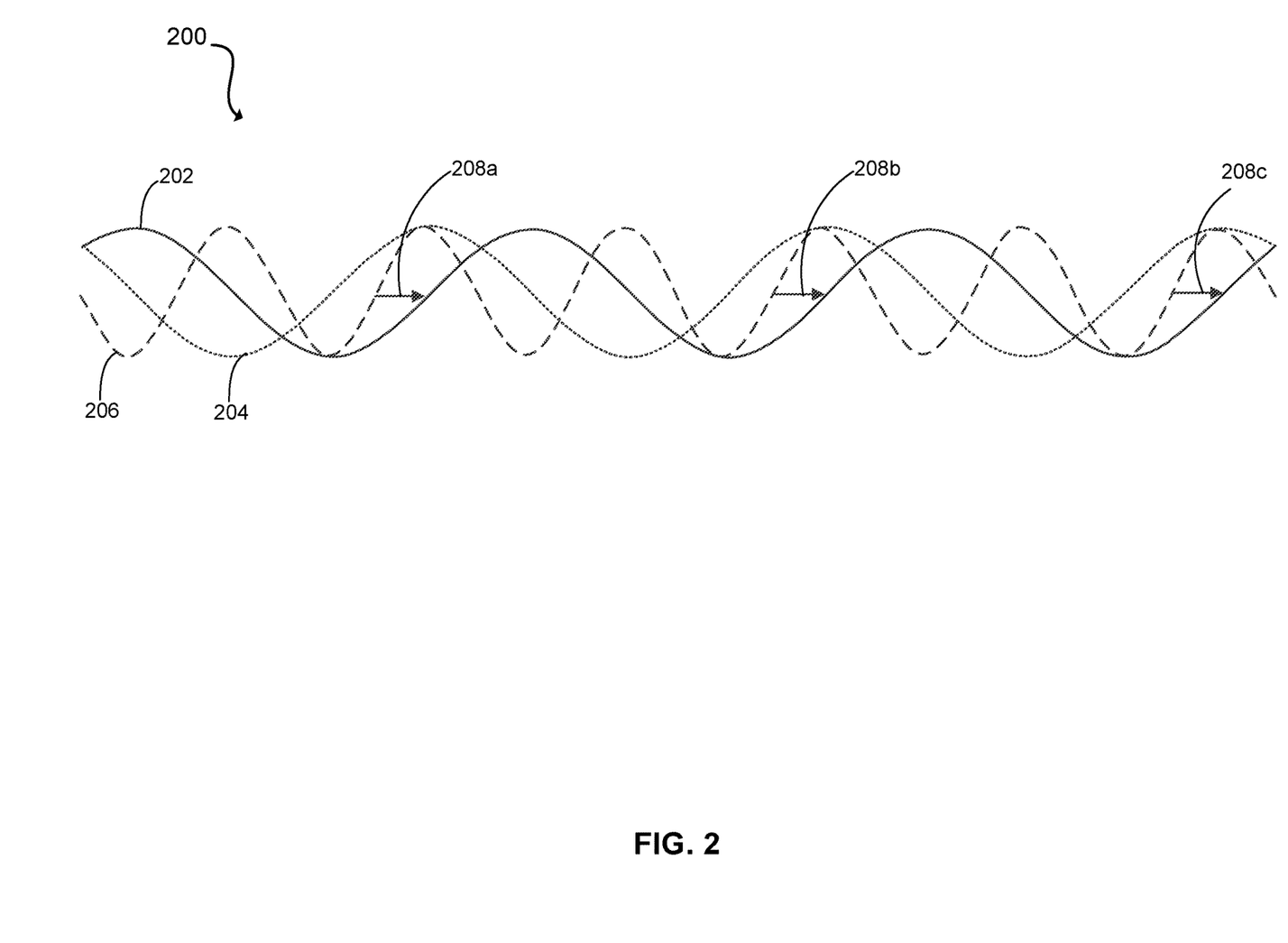
FIG. 2 illustrates two differential output clocks having a phase difference of 90°, in accordance with an embodiment of the present disclosure.

FIG. 2 illustrates two differential output signals (e.g., output clocks) having a phase difference of 90°, in accordance with an embodiment of the present disclosure. Schematic 200 shows a first differential signal (VI+−VI−) 202 of frequency ω, a second differential signal (VQ+−VQ−) 204 of frequency ω, and an input signal 206 (e.g., VCO clock signal CLK+−CLK−) of frequency 2ω. In some aspects, the input signal 206 may correspond to the input signal of the frequency divider 100. The first differential signal 202 may correspond to an output signal of the frequency divider 100. Arrows 208a, 208b, and 208c represent an angle θ that corresponds to the phase angle between input signal 206 and first differential signal 202 in a locked or steady-state condition.

In the steady state, the phase relationship between the input and output phases remains constant (i.e., equal to θ). Power supply ($V_{DD}$) disturbances may cause modulation of an output impedance gas of differential pairs (e.g., D-cell 104a and D-cell 104b). The modulation of the output impedance gas may cause the modulation of the output time-constant τ of the D-latch. The output time-constant τ may be expressed by equation 1, as shown below. It can be shown that the rate of change of the output impedance gas with respect to the power-supply $V_{DD}$ is positive.

$$\tau = \frac{C_L}{\frac{1}{R_L} + g_{ds_D} - g_{m_N}} \qquad \text{Eq. 1}$$

The disturbance in the power supply $V_{DD}$ causes instantaneous changes in the angle θ that represents the power-supply induced noise ($d\theta/dV_{DD}$). The power-supply induced noise is given by equation 2 for an output frequency ω.

$$\frac{d\theta}{dV_{DD}} = \frac{\omega}{\sec^2\theta} \frac{d\tau}{dV_{DD}} \qquad \text{Eq. 2}$$

Figure 3:
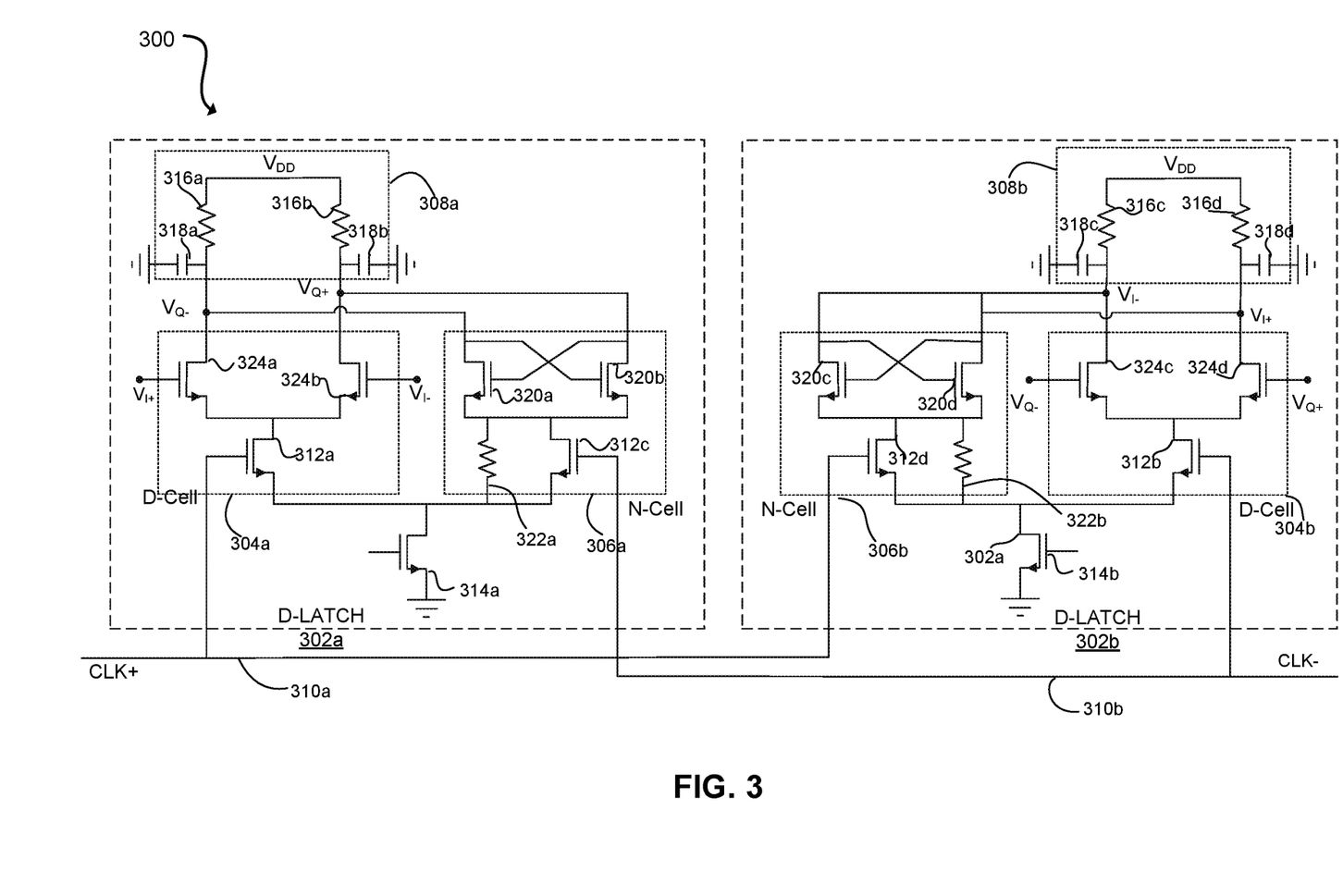
FIG. 3 illustrates a frequency divider with a bias resistor, in accordance with an embodiment of the present disclosure.

FIG. 3 illustrates a frequency divider in accordance with an embodiment of the present disclosure. A frequency divider 300 may include two cross-coupled common logic circuits. In some aspects, frequency divider 300 includes a first D-latch 302a and a second D-latch 302b connected as shown in FIG. 3. Frequency divider 300 receives a differential input signal 310a, 310b (Clk+ and Clk−). Frequency divider 300 may generate two pairs of differential output signal, I and Q. For example, a first differential output signal I include signal I+ and I−. A second differential output signal Q includes Q+ and Q−. In some aspects, the differential input signal may correspond to input signal 206 of FIG. 2 such as a VCO clock signal.

In some embodiments, each D-latch includes a D-cell that is a differential pair and an N-cell that is a cross-coupled transistor pair (i.e., a negative Gm cell). First D-latch 302a includes a first D-cell 304a and a first N-cell 306a. Second D-latch 302a includes a second D-cell 304a and a second N-cell 306b.

In some embodiments, first D-cell 304a may be driven by a first transistor 312a. Second D-cell 304b may be driven by a second transistor 312b. First N-cell 306a is driven by a third transistor 312c. Second N-cell 306b is driven by a fourth transistor 312d. First transistor 312a and fourth transistor 312d are connected to differential input signal 310a (Clk+). Second transistor 312b and third transistor 312c are connected to differential input signal 310b (Clk−).

In some embodiments, first D-cell 304a senses the state of second D-latch 302b and transfer that state to first load tank 308a when first transistor 312a is clocked high by differential input signal 310a. When first transistor 312a is clocked low by differential input signal 310a and third transistor 312c is clocked high by signal 310b, N-cell 306a latches the state of the first load tank 308a. In this manner, output signals I+ and I− oscillate at half the frequency of input signal 310. Similarly, output signals Q+ and Q− oscillate at half the frequency of Clk. Since D-latch 302b receives clk+ and clk− in opposite polarity compared to first D-latch 302a, the differential output pair (Q+,Q−) and the differential pair (I+,I−) are in phase quadrature.

In some aspects, first transistor 312a and third transistor 312c are biased using a first current source. In some aspects, the first current source may be implemented using a fifth transistor 314a. Second transistor 312b and fourth transistor 312d are biased using a second current source. In some aspects, the second current source may be implemented using sixth transistor 314b. Transistors 312a, 312b, 312c, 312d, 314a, 314b push the currents into first load tank 308a and a second load tank 308b. In some aspects, first load tank 308a may be an RC load tank. For example, first load tank 308a may include a first resistor 316a and a second resistor 316b coupled to a power supply VDD. First load tank 308a may also include a first capacitor 318a and a second capacitor 318b coupled between first resistor 316a, second resistor 316b and ground, respectively.

In some embodiments, second load tank 308b may include a third resistor 316c and a fourth resistor 316d coupled to the power supply VDD. Second load tank 308b also includes a third capacitor 318c and a fourth capacitor 318d coupled between third resistor 316c, fourth resistor 316d and ground, respectively.

In some embodiments, first load tank 308a and second load tank 308b may each be a RLC load tank or some other complex load tank.

In some embodiments, first N-cell 310 may include a cross-coupled transistor pair that includes a seventh transistor 320a and a eighth transistor 320b. Seventh transistor 320a and eight transistor 320b may be metal oxide semiconductor field effect transistors (MOSFETs). The drain of each of seventh transistor 320a and eighth transistor 320b is connected to the gate terminal of the other transistor. The drain terminals of seventh transistor 320a and eighth transistor 320b are coupled to opposite terminals of first load tank 308a. The source terminals of the seventh transistor 320a and eighth transistor 320b are coupled to the drain terminal of transistor 312c.

In some embodiments, second N-cell 306b may include a cross-coupled transistor pair that includes a ninth transistor 320c and a tenth transistor 320d. The drain of each of ninth transistor 320c and tenth transistor 320d is connected to the gate terminal of the other transistor. The drain terminals of ninth transistor 320c and tenth transistor 320d are coupled to opposite terminals of second load tank 308b. The source terminals of the ninth transistor 320c and tenth transistor 320d are coupled to the drain terminal of transistor 312d.

In some embodiments, the power-supply induced jitter may be minimized when $d\tau/dV_{DD}$ is controlled to be as small as possible. A biasing circuit may be added to the cross-coupled pairs (N-cell) to keep $d\tau/dV_{DD}$ as small as possible.

In some embodiments, first N-cell 306a may include a biasing circuit configured to bias first N-cell 306a in a triode region (including the linear region). The biasing circuit is configured to bias third transistor 312c in a triode region as opposed to a saturation region in a conventional frequency divider (e.g., frequency divider 100). This causes a rate of change of gmN with respect to $V_{DD}$ ($dg_{mN}/dV_{DD}$) to be positive as opposed to gmN being constant in a conventional frequency divider. This enabling of the movement of the transconductance of the cross-coupled pair compensates for the change in the output impedance of the differential pair (i.e., D-cell) that results in a reduced power-supply induced jitter.

In some aspects, the biasing circuit may modify an output impedance of the differential pair (i.e., first D-cell 304a). In some aspects, first N-cell 306a may include a first biasing resistor 322a. First biasing resistor 322a may be coupled in parallel to third transistor 312c. The current passing through first biasing resistor changes with power supply VDD which creates a nullifying effect of the jitter by changing the output impedance. The current passing through third transistor 312c is substantially constant with power supply VDD.

In some embodiments, second N-cell 306b may include a biasing circuit configured to bias second N-cell 306b in a linear region. The biasing circuit is configured to bias fourth transistor 312d in a triode region as opposed to a saturation region in a conventional frequency divider (e.g., frequency divider 100). In some aspects, the biasing circuit may modify an output impedance of second D-cell 304b. In some aspects, second N-cell 306b may include a second biasing resistor 322b. Second biasing resistor 322b may be coupled in parallel to fourth transistor 312d. The current passing through second biasing resistor 322b changes with power source VDD. The current passing through fourth transistor 312d is substantially constant with power source VDD. First biasing resistor 322a and second biasing resistor 322b show minimal effect on parameters of the frequency divider 100 (e.g., output swing, random-noise, and locking-range).

In some embodiments, the biasing circuit may include a biasing transistor configured to bias the third transistor 312c in a triode region. For example, a biasing transistor may be coupled in parallel to third transistor 312c and another transistor may be coupled in parallel to fourth transistor 312d.

In some embodiments, the biasing circuit may include a N-cell configured to bias first N-cell 306a and second N-cell 306b in a linear region.

In some embodiments, the current from the source of cross-coupled transistor pair of the N-cell is divided between the biasing circuit and the corresponding trail transistor (i.e., third transistor 312c or fourth 312d). For example, a ratio between the current passing through third transistor 312c and/or fourth transistor 312d and the biasing circuit is configured to minimize the jitter. In some aspects, the value of first biasing resistor 322a and second biasing resistor 322b may be based on the output impedance of the transistors including the first D-cell 304a and second D-cell 304b.

In some embodiments, first D-cell 304a may include eleventh transistor 324a and twelfth transistor 324b. The gate of eleventh transistor 324a and the gate of twelfth transistor 324b are coupled to opposite terminals of second load tank 308b (labelled as $V_{I-}$ and $V_{I+}$ in FIG. 3).

In some embodiments, second D-cell 304b may include thirteenth transistor 324c and fourteenth transistor 324d. The gate of thirteenth transistor 324c and the gate of fourteenth transistor 324d are coupled to opposite terminals of first load tank 308a (labelled as $V_{Q-}$ and $V_{Q+}$ in FIG. 3).

In some embodiments, frequency divider 300 is a part of a PLL. For example, frequency divider 300 may be incorporated into a feedback path of the PLL. The PLL may include a voltage controlled oscillator that produces an output signal. The output signal may be supplied to frequency divider 300 to create an injection current in frequency divider 300. Frequency divider 300 may divide a frequency to produce a correspondingly lower frequency signal that is provided to a phased detector of the PLL.

The frequency divider described herein may be used in numerous other applications. For example, when used as part of the PPL, the frequency divider may be used in in a transceiver.

Figure 4:
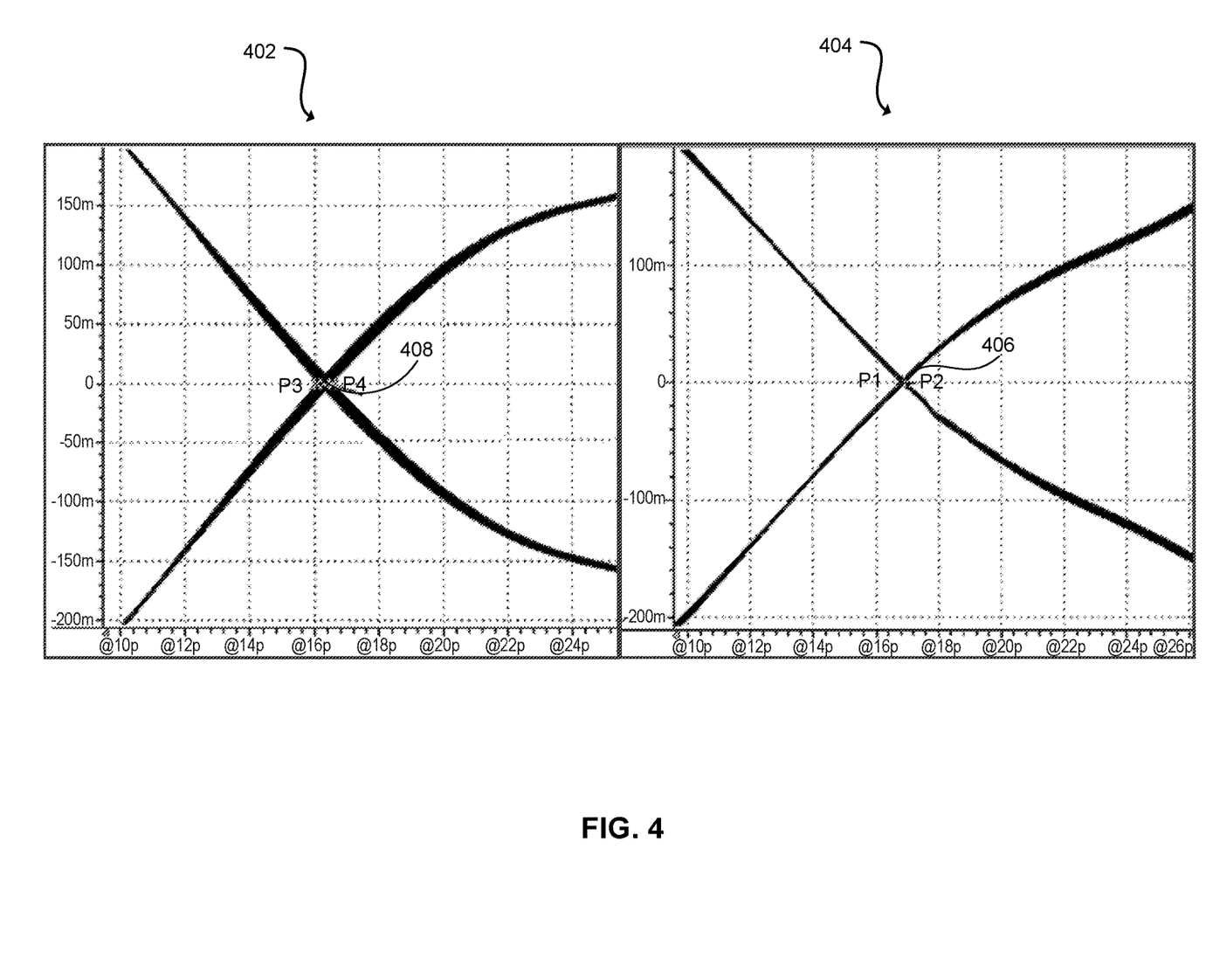
FIG. 4 illustrates power-supply induced jitter, in accordance with an embodiment of the present disclosure.

By way of a non-limiting example, based on the design and technology used, the addition of a biasing resistor may compensate power-supply jitter, bringing it down to approximately 25% of its original value, as shown FIG. 4.

FIG. 4 illustrates power-supply induced jitter, in accordance with an embodiment of the present disclosure. Schematic 402 shows an eye diagram for frequency divider 100 of FIG. 1. Schematic 402 shows an eye diagram associated with frequency divider 300 of FIG. 3. Jitter may correspond to the edge of the eye diagram. For example, the jitter value for frequency divider 300 is equal to the band between P1 and P2 indicated by 406 in schematic 404. The jitter value for frequency divider 100 is equal to the band between P3 and P4 indicated by 408 in schematic 402. The jitter value for the frequency divider 300 is about 115 fs whereas the jitter value for conventional frequency divider 100 is 479.2 fs. Thus, the frequency divider described herein reduces power-supply induced jitter.

Figure 5:
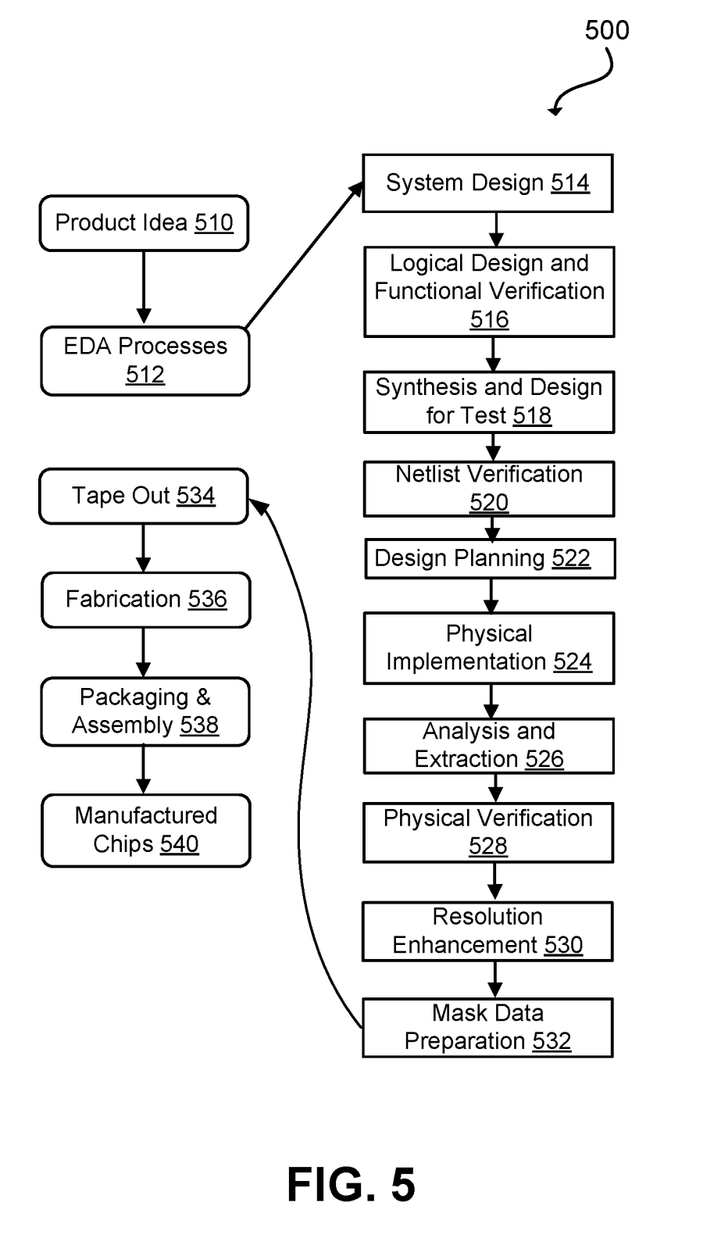
FIG. 5 illustrates a flowchart of various processes used during the design and fabrication of an integrated circuit, according to an exemplary embodiment of the present disclosure.

FIG. 5 illustrates an example set of processes 500 used during the design, verification, and fabrication of an article of manufacture such as an integrated circuit to transform and verify design data and instructions that represent the integrated circuit. Each of these processes can be structured and enabled as multiple modules or operations. The term 'EDA' signifies the term 'Electronic Design Automation.' These processes start with the creation of a product idea 510 with information supplied by a designer, information that is transformed to create an article of manufacture that uses a set of EDA processes 512. When the design is finalized, the design is taped-out 734, which is when artwork (e.g., geometric patterns) for the integrated circuit is sent to a fabrication facility to manufacture the mask set, which is then used to manufacture the integrated circuit. After tape-out, a semiconductor die is fabricated 536, and packaging and assembly processes 538 are performed to produce the finished integrated circuit 540.

Specifications for a circuit or electronic structure may range from low-level transistor material layouts to high-level description languages. A high-level of abstraction may be used to design circuits and systems, using a hardware description language ('HDL') such as VHDL, Verilog, SystemVerilog, SystemC, MyHDL or OpenVera. The HDL description can be transformed to a logic-level register transfer level ('RTL') description, a gate-level description, a layout-level description, or a mask-level description. Each lower abstraction level that is a less abstract description adds more useful detail into the design description, for example, more details for the modules that include the description. The lower levels of abstraction that are less abstract descriptions can be generated by a computer, derived from a design library, or created by another design automation process. An example of a specification language at a lower level of abstraction language for specifying more detailed descriptions is SPICE, which is used for detailed descriptions of circuits with many analog components. Descriptions at each level of abstraction are enabled for use by the corresponding tools of that layer (e.g., a formal verification tool). A design process may use a sequence depicted in FIG. 6. The processes described by being enabled by EDA products (or tools).

During system design 514, the functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During the logic design and functional verification 516, modules or components in the circuit are specified in one or more description languages, and the specification is checked for functional accuracy. For example, the components of the circuit may be verified to generate outputs that match the requirements of the specification of the circuit or system being designed. Functional verification may use simulators and other programs such as test bench generators, static HDL checkers, and formal verifiers. In some embodiments, special systems of components referred to as 'emulators' or 'prototyping systems' are used to speed up the functional verification.

During synthesis and design for test 518, HDL code is transformed into a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 520, the netlist is checked for compliance with timing constraints and for correspondence with the HDL code. During design planning 522, an overall floor plan for the integrated circuit is constructed and analyzed for timing and top-level routing.

During layout or physical implementation 524, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flip-flop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 526, the circuit function is verified at the layout level, which permits refinement of the layout design. During physical verification 528, the layout design is checked to ensure that manufacturing constraints are correct, such as DRC constraints, electrical constraints, lithographic constraints, and that circuitry function matches the HDL design specification. During resolution enhancement 530, the geometry of the layout is transformed to improve how the circuit design is manufactured.

During tape-out, data is created to be used (after lithographic enhancements are applied if appropriate) for the production of lithography masks. During mask data preparation 532, the 'tape-out' data is used to produce lithography masks that are used to produce finished integrated circuits.

A storage subsystem of a computer system (such as computer system 600 of FIG. 6) may be used to store the programs and data structures that are used by some or all of the EDA products described herein, and products used for the development of cells for the library and for the physical and logical design that use the library.

Figure 6:
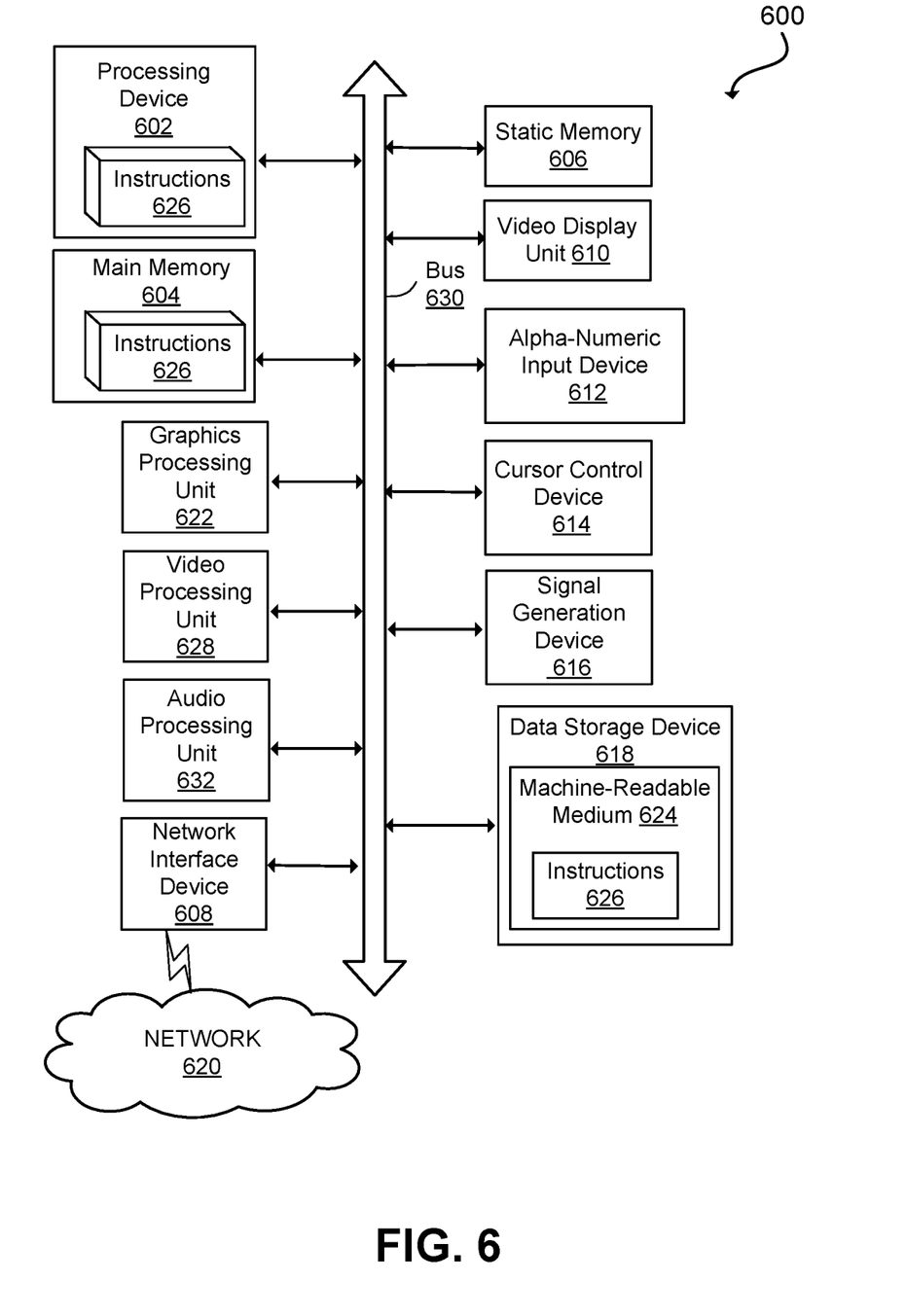
FIG. 6 illustrates a diagram of an example computer system in which embodiments of the present disclosure may operate.

FIG. 6 illustrates an example machine of a computer system 600 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in a client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM), a static memory 606 (e.g., flash memory, static random access memory (SRAM), etc.), and a data storage device 618, which communicate with each other via a bus 630.

The processing device 602 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. The processing device 702 may also be one or more special-purpose processing devices such as an application-specific integrated circuit (ASIC), a field-programmable gate array (FPGA), a digital signal processor (DSP), network processor, or the like. The processing device 602 may be configured to execute instructions 626 for performing the operations and steps described herein.

The computer system 600 may further include a network interface device 608 to communicate over the network 620. The computer system 600 also may include a video display unit 610 (e.g., a liquid crystal display (LCD) or a cathode ray tube (CRT)), an alphanumeric input device 612 (e.g., a keyboard), a cursor control device 614 (e.g., a mouse), a graphics processing unit 622, a signal generation device 616 (e.g., a speaker), graphics processing unit 622, video processing unit 628, and audio processing unit 632.

The data storage device 618 may include a machine-readable storage medium 624 (also known as a non-transitory computer-readable medium) on which is stored one or more sets of instructions 626 or software embodying any one or more of the methodologies or functions described herein. The instructions 626 may also reside, completely or at least partially, within the main memory 604 and/or within the processing device 602 during execution thereof by the computer system 600, the main memory 604, and the processing device 602 also constituting machine-readable storage media.

In some implementations, the instructions 626 include instructions to implement functionality corresponding to the present disclosure. While the machine-readable storage medium 624 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 602 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to convey the substance of their work to others skilled in the art most effectively. An algorithm may be a sequence of operations leading to the desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer-readable storage medium, such as but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure, as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as read-only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures, and like elements are labeled with like numerals. The disclosure and drawings are, accordingly, to be regarded in an illustrative sense rather than a restrictive sense.

What is claimed is:

1. A circuit, comprising:
   a clock generator configured to generate a clock signal of a first frequency;
   a frequency divider comprising a first pair of cross coupled transistors, wherein the frequency divider is configured to produce the clock signal of a second frequency; and
   a first biasing circuit coupled between a current source transistor and the first pair of cross coupled transistors of the frequency divider, wherein the first biasing circuit is adapted to enable a change in a transconductance of the first pair of cross coupled transistors to stabilize a phase angle between the clock signal at the first frequency and the clock signal at the second frequency, the change in the transconductance being positive relative to a change in power supply voltage of the frequency divider.

2. The circuit of claim 1, wherein the frequency divider further comprises a first transistor coupled to a source terminal of the first pair of cross coupled transistors, and wherein the first biasing circuit comprises a first biasing resistor coupled in parallel to the first transistor.

3. The circuit of claim 1, wherein the frequency divider further comprises a first transistor coupled to a source terminal of the first pair of cross coupled transistors, and wherein the first biasing circuit comprises a first biasing transistor coupled in parallel to the first transistor.

4. The circuit of claim 1, wherein the frequency divider further comprises a second pair of cross coupled transistors; and the circuit further comprising a second biasing circuit, wherein the second biasing circuit is coupled to the second pair of cross coupled transistors at a source terminal.

5. The circuit of claim 4, wherein the frequency divider further comprises:
   a first differential pair comprising a second transistor and a third transistor coupled together at a source terminal of each other, and wherein a quadrature differential output signal is present between respective drains of the second transistor and the third transistor; and
   a second differential pair comprising a fourth transistor and a fifth transistor coupled together at a source terminal of each other, and wherein an in-phase differential output signal is present between respective drains of the fourth and the fifth transistors.

6. The circuit of claim 1, wherein the frequency divider further comprises a first transistor coupled to a source terminal of the first pair of cross coupled transistors; and
   wherein the first biasing circuit comprises a third pair of cross coupled transistors coupled to the first transistor and configured to bias the first transistor in a triode region.

7. The circuit of claim 1, wherein the frequency divider further comprises a first resonant tank coupled between the first pair of cross coupled transistors and a supply voltage node.

8. The circuit of claim 1, further comprising:
   a locked loop circuit comprising a feedback path to incorporate the frequency divider.

9. The circuit of claim 1, further comprising:
   a receiver or a transmitter, wherein the receiver or transmitter comprises the frequency divider.

10. The circuit of claim 1, wherein the frequency divider is implemented by current mode logic (CML).

11. A frequency divider, comprising:
    a pair of cross-coupled common mode logic (CML) circuits configured to receive an input signal of a first frequency and to produce an output signal of a second frequency, wherein the second frequency corresponds to the first frequency divided by a factor of two or more; and
    a first biasing circuit coupled with a first transistor of a first CML circuit of the pair of cross-coupled CML circuits and configured to bias the first transistor in a triode region, wherein a gate terminal of the first transistor is coupled to the input signal.

12. The frequency divider of claim 11, wherein the first biasing circuit comprises a resistor, the resistor being coupled in parallel with the first transistor.

13. The frequency divider of claim 11, wherein the first CML circuit of the pair of cross coupled CML circuits includes a pair of cross coupled transistors coupled between a resonant tank of the first CML circuit and the first biasing circuit.

14. The frequency divider of claim 13, wherein respective source terminals of the cross-coupled transistors are coupled together; and wherein a first lead of the first biasing circuit is coupled to the source terminals and a second lead of the first biasing circuit is coupled to a drain of a second transistor, the second transistor being coupled between a drain of the first transistor and ground.

15. The frequency divider of claim 11, further comprising:
    a second biasing circuit coupled to a third transistor of a second CML circuit of the pair of cross-coupled CML circuits; and wherein the second biasing circuit is configured to bias the third transistor in the triode region.

16. The frequency divider of claim 15, wherein the second CML circuit of the pair of cross coupled CML circuits includes a pair of cross coupled transistors coupled between a resonant tank of the second CML circuit and the second biasing circuit.

17. The frequency divider of claim 16, wherein respective source terminals of the pair of cross coupled transistors of the second CML circuit are coupled together; and wherein a first lead of the second biasing circuit is coupled to the source terminals and a second lead is coupled to a drain of a fourth transistor, the fourth transistor being coupled between a drain of the third transistor and ground.

18. An apparatus comprising the frequency divider of claim 11.

19. A circuit, comprising:
a clock generator configured to generate a clock signal of a first frequency;
a frequency divider configured to receive the clock signal and to produce an output signal of a second frequency, the frequency divider comprising a pair of cross-coupled common mode logic (CML) circuits, wherein each CML circuit comprises a differential transistor pair, a cross-coupled transistor pair, and a biasing circuit between a current source transistor and the cross coupled transistor pair, and
wherein the biasing circuit is configured to bias a respective cross-coupled transistor pair in a triode region.

20. The circuit of claim 19, wherein the biasing circuit comprises a biasing resistor.

\* \* \* \* \*